United States Patent [19]

Tschulena

[11] Patent Number: 5,223,747
[45] Date of Patent: Jun. 29, 1993

[54] HEAT DISSIPATING DEVICE

[75] Inventor: Guido Tschulena, Wehrheim, Fed. Rep. of Germany

[73] Assignee: Battelle-Institut e.V., Frankfurt am Main, Fed. Rep. of Germany

[21] Appl. No.: 716,320

[22] Filed: Jun. 17, 1991

[30] Foreign Application Priority Data

Jun. 15, 1990 [DE] Fed. Rep. of Germany ....... 4019091

[51] Int. Cl.[5] ..................... H01L 39/02; H01L 25/04
[52] U.S. Cl. .................................. 257/713; 257/714; 257/722; 165/80.3; 165/80.4; 361/385
[58] Field of Search .................. 357/81, 82; 361/385; 165/80.3, 80.4; 257/713, 714, 722

[56] References Cited

U.S. PATENT DOCUMENTS

| | | | |
|---|---|---|---|
| 3,215,194 | 11/1965 | Sununu et al. | 165/80 |
| 3,780,356 | 12/1973 | Laing | 357/81 |
| 4,323,914 | 4/1982 | Berndlmaier et al. | 357/82 |
| 4,833,567 | 5/1989 | Saaski et al. | 361/385 |
| 4,962,416 | 10/1990 | Jones et al. | 357/81 |
| 5,012,858 | 5/1991 | Natori et al. | 357/81 |
| 5,014,777 | 5/1991 | Sano | 357/81 |

FOREIGN PATENT DOCUMENTS

| | | |
|---|---|---|
| 0251836 | 1/1988 | European Pat. Off. . |
| 0264892 | 4/1988 | European Pat. Off. . |
| 1041600 | 10/1958 | Fed. Rep. of Germany . |
| 1042132 | 10/1958 | Fed. Rep. of Germany . |
| 1106423 | 6/1959 | Fed. Rep. of Germany . |
| 2003393 | 8/1970 | Fed. Rep. of Germany . |
| 2441613 | 3/1976 | Fed. Rep. of Germany . |
| 3735818 | 5/1988 | Fed. Rep. of Germany . |
| 546480 | 1/1974 | Switzerland . |

OTHER PUBLICATIONS

C. M. Osburn et al., "Structure and Process for a Silicon Wafer Chip Carrier", Research Disclosure, Apr. 1988.
A. Heuberger, Micromechanik, 1989, pp. 128–140, and pp. 478–483, (Springer Verlag).
J. M. Eldridge and K. E. Petersen, IBM Technical Disclosure Bulletin, vol. 25 No. 8, Jan. 1983, pp. 4118–4119.

Primary Examiner—Rolf Hille
Assistant Examiner—David Ostrowski
Attorney, Agent, or Firm—Spencer, Frank & Schneider

[57] ABSTRACT

Heat dissipating devices for electronic component semiconductor chips are provided in the form of channels or grooves which are either integrated in the underside of the semiconductor chip or are formed in an additional thin semiconductor chip which has larger dimensions than the component chip and which is disposed between the underside of the component chip and the mounting base for the component chip. The channels are filled with a meltable material which is subjected to a heat absorbing phase conversion at temperatures which are critical for semiconductor component operation. In this way, short-term heat peaks in particular, can be reliably dissipated. Preferably, the channels are formed by micromechanical etching techniques and are preferably filled to the desired degree by a spin coating process.

14 Claims, 3 Drawing Sheets

PRIOR ART

HEAT DISSIPATING DEVICE

CROSS-REFERENCE TO RELATED APPLICATIONS

This application is related to Applicant's concurrently filed U.S. application Ser. No. 07/716,261, now abandoned, corresponding to German Patent Application P 40 19 090.0-45, filed Jun. 15th, 1990) the subject matter of which is incorporated herein by reference. This application claims the priority of German application Serial No. P 40 19 091.3-33 filed Jun. 15th, 1990, which is incorporated herein by reference.

BACKGROUND OF THE INVENTION

The present invention relates to heat dissipating devices, particularly for electronic semiconductor elements, and to methods of producing such devices.

Numerous conventional electronic semiconductor components, for example, simple components such as integrated circuits or also possibly silicon sensors, are applied, for example, as shown in FIG. 1, in the form of a semiconductor chip 1 to a housing base or bottom 4 via an adhesive or solder layer 6. On the one hand, the housing or, more precisely, the housing base 4, is intended to protect the chip against environmental influences. On the other hand, the housing base 4 should permit, via contact pins 3 provided therein and wires 2 bonded to the contact pins 3, the establishment of a releasable contact between the component and a base or printed circuit board 8. Moreover, the heat from the power consumed in the chip 1 is to be transferred by way of the housing bottom 4 and the contact pins 3 into the printed circuit board 8 and a heat dissipating body 9. In order to determine the temperature distribution between the chip 1 and the housing, heat balance considerations are made.

The heat generated in the silicon chip 1 is essentially transported from the chip to the housing by way of heat conduction (primarily heat diffusion). In the housing, the heat spreads out over the housing bottom 4 and heats it somewhat. This heat is removed, on the one hand, by thermal conduction from housing bottom 4 to housing cover 7 and, on the other hand, by way of convection into the air. Moreover, contact pins 3, in particular, remove heat from the housing bottom into the printed circuit board 8 disposed therebelow or into hybrid electronic ceramic devices. These considerations apply for standard housings such as, for example, TO5 and SOT housings, and similarly for special housings.

In SMD housings, heat is dissipated analogously from the heat generating chips into the encapsulation and to the legs of the housing. The silicon chips are here usually glued to bases. The electrical contacts between the silicon chips and the metal pins are produced by bonding.

The thermal energy to be dissipated generally develops in the circuits that are integrated in the surface of the silicon semiconductor chips. The heat generated by the power consumed there must be conducted initially through the silicon or other semiconductor material over a path of generally between 100 μm and 600 μm. This causes the thermal front to be broadened somewhat. The adhesive or solder then conducts the heat further into the metal base of the housing. A heat transfer resistance of about 0.42 W/K can here be observed in the adhesive. Conventional fastening techniques permit only a limited amount of heat to be conducted away from the silicon chip because the temperature of the chip surface sets itself as the equilibrium between the generated thermal energy and the dissipated thermal energy. FIG. 2 shows the resulting temperature curve for the various regions and transition locations of the semiconductor arrangement. The temperature of the chip surface, which for silicon may lie between a maximum of 125° C. and 150° C. is marked with the reference numeral 1. It is followed by the adhesive or solder location 6, the housing bottom 4, the metal/glass connection 10 between housing bottom 4 and printed circuit board or base 8, which is distinguished by contact heat conduction, the heat dissipating body 9, for example, in the form of a metal cooling sheet, and the environment, indicated by reference numeral 11, which is at room temperature.

The sketched temperature curve is the result of an exchange of heat that develops according to the above-mentioned equilibrium. The heat exchange must ensure that the maximum permissible temperature of the silicon between 125° C. and 150° C. is not exceeded, since at higher temperatures silicon becomes inherently conductive and the intended function of the electronic components can no longer be maintained. It must also be noted that already at temperatures between 100° C. and 125° C., the blocking voltages and the blocking currents of the diodes and transistors as well as other parameters become worse. It has been found that, with air cooling, it is possible to dissipate power losses of at most a few watts. Even with forced-air cooling, up to about 5 watts can be dissipated. This is also the case if, instead of an adhesive connection, so-called eutectic die bonds are employed which produce a lower heat transfer resistance of 0.33 W/K.

In the past, a number of passive cooling measures have been proposed which attempt to produce sufficient cooling during operation of the semiconductor simply by the conduction of heat with the aid of cooling bodies. For example, DE 3,735,818 A1 discloses a passive cooling device in the form of an auxiliary silicon chip or substrate which simultaneously serves as a cooling body and a protective resistor for a light emitting element in chip form disposed on its top face. The rear surface of this auxiliary chip or substrate is fastened to a larger conventional cooling body which, in turn, is attached to a frame structure. However, such measures do not constitute a satisfactory solution of the described problems.

In order to improve heat dissipation, the substrate or printed circuit board, for example, is cooled. However, this does not provide for direct cooling of the chip without heat transfer resistances and is effective only in conjunction with intermediate layers that are good thermal conductors. Moreover, the great thermal capacity of such systems prevents the dissipation of, in particular, short heat pulses occurring in rapid succession without integratingly heating the cooling system. The possibility of a more direct and thus faster heat dissipation is discussed in the chapter, entitled "Verbesserung der Wärmeableitung durch mikrostrukturiertes Silizium" (Improvement of Heat Dissipation Through Microstructured Silicon) of the book by A. Heuberger, entitled "Micromechanik" (Micromechanics), published by Springer Verlag, 1989, pages 480–483. It is proposed there to work troughs into the silicon and, in order to increase thermal conduction, fill them with metals such as gold, copper or silver. Heat transfer is then established in the chip to these troughs filled with little metal balls via metal connecting pins.

Even more effective cooling results if channels are formed in the underside of the silicon chip and a coolant, e.g., water, is actively conducted through these channels. The relatively deep troughs or channels required for this purpose may be formed either by sawing or by a special crystal orientation dependent etching technique as disclosed in chapter 3.2.1 "Anisotrope Ätzverfahren" (Anisotropic Etching Methods), pages 128-140 of the above mentioned book. This technique is a wet chemical depth etching technique for micromechanical components employing various possible etching solutions. Troughs or grooves of a depth and width in a range from 0.1 µm up to several 10 µm can be easily realized with this technique.

The described liquid cooling results in very good heat dissipation, depending on the pumping speed up to a heat dissipating output of theoretically more than 1000 watts for a chip. However, short-term heat pulses in particular can be dissipated at sufficient speed only if flow rates are correspondingly high.

Additionally, IBM Technical Disclosure Bulletin, 1983, Volume 25, No. 8, pages 4118-4119 discloses a device in which channels are formed in the top face of a cooling chip by an anisotropic etching technique, with the cooling chip being bonded to the rear face of a smaller semiconductor chip. This arrangement is disposed in a so-called heat pipe structure which ensures that the liquid evaporated as a result of heat development in the semiconductor chip is transported to the cooler end of the heat pipe structure where the vapor condenses. The condensate is cooled by means of a heat sink and is then transported back into the channels by means of capillary effect. The channels in the cooling chip are intended to increase the surface area of the chip and serve to provide improved heat transfer.

The drawbacks of this closed device, which is based essentially on a mechanism for transporting gases or liquids to remove the heat, are obvious. Compared to the actual semiconductor chip, the entire arrangement is very large and operates only if the repeated or continuous filling of the channels by capillary action can be ensured for a long period of time. Also, the vapor atmosphere in the vicinity of an electronic unit is anything but ideal.

EP 0,251,836 A1, corresponding to U.S. Pat. No. 4,833,567, in principle, discloses a similar heat pipe structure with channels, that are partially filled with the evaporated liquid, being formed either directly within the chip or in a cap in the form of a chip of the same material that is glued to the chip. Again, a heat sink and a transporting device in the form of a wick are provided to conduct the heat away and to return the condensate. The heat is dissipated essentially by the described circulation mechanism for transporting the vapor to the cooling body and the return of the condensate.

According to DE-AS 2,441,613, a dielectric heat conducting layer of $SiO_2$ having an upper and a lower cover layer of $Si_3N_4$ is provided on the semiconductor chip, with inwardly widened channels being etched into the cover layer facing away from the semiconductor chip. Here again, the evaporation of a liquid absorbed into the heat conducting layer is utilized, and interruptions in the heat conducting layer are provided to ensure unimpeded evaporation. In order to realize the necessary condensate return, a wick structure is again provided within a housing.

SUMMARY OF THE INVENTION

It is an object of the present invention to provide a heat dissipating arrangement or device, and a method of producing such an arrangement or device, which permits further improved reliable heat dissipation, particularly also for short-term, pulse-like heat generation in the circuits, while being easy to manufacture and particularly in a compact form.

The above object is generally achieved according to the present invention by a heat dissipating arrangement for semiconductor electronic components which comprises: a chip of semiconductor material having a front surface for receiving semiconductor components and a rear surface; a plurality of heat dissipation grooves provided in the rear surface of the semiconductor chip; and at least one meltable substance disposed in the channels with the meltable substance being of the type which is subjected to a heat absorbing phase conversion from solid to liquid when a predetermined temperature which is critical for operation of a semiconductor component at the front surface is exceeded. The semiconductor component may be formed in the front surface of the semiconductor chip, or may be provided in a further separate chip of semiconductor material fastened to the front surface of the chip containing the grooves.

Thus, according to the invention, the meltable substrate or material which undergoes an endothermal phase conversion from solid to liquid above a certain temperature, and thus primarily at corresponding short-term heat pulses from the electronic semiconductor chip, accommodated in channels or grooves cut into the underside of an electronic semiconductor chip, or in a further heat dissipating semiconductor chip fastened to the underside of the electronic chip, permits the immediate reduction of short-term heat peaks. With this increased heat dissipation and thus lower thermal capacity of these devices, it can be reliably prevented that short-term heat pulses drive the electronic semiconductor chip to temperatures in the vicinity of or above the maximum permissible temperature for the semiconductor material.

Compared to the prior art heat pipe structures, which provide for active cooling by way of the evaporation of a liquid, there exists the decisive advantage that the entire device can be made much more compact and durable as well as a closed structure due to the avoidance of heat exchange by material transport, and merely requires the introduction of the meltable materials into the channels or grooves without any additional structure.

Although low melting point substances have been disclosed in the early stages of the transistor art as embedment substances outside of the transistor chip, these substances served at most as active heat dissipators during manufacture and not during operation of the transistor where only the passive heat dissipation by way of the solidified embedment substances was utilized.

For example, in DE-AS 1,041,600, a metal filler material in which the transistor and its terminals were embedded in a housing through the intermediary of a thin layer of insulating material served to ensure a good passive heat dissipation to the metal housing during transistor operation. Since the filler material itself was employed as a soldering agent to seal the housing and was poured into the housing in a liquid state in order to firmly embed the transistor, materials such as tin, cadmium, lead or bismuth and alloys thereof were employed which had melting points lower than 150° C. and preferably lower than 70° C.

According to DE-AS 1,042,132, paraffin was proposed as the filler substance between the chip and housing for the embedment of a transistor. This paraffin was likewise filled into the housing in liquid form. After the paraffin had solidified, the sealing of the housing began and the fact was utilized that, due to the heat consumed for melting the filler material, the temperature would not exceed the melting temperature, in spite of the constant influx of heat during melting of the housing, until all of the filler material had melted. However, this active cooling effect of the embedment material was utilized only for the sealing of the housing.

In contrast thereto, the meltable substances according to the present invention are employed, on the one hand, not for embedding but for partially filling the channels of the heat dissipating device and, on the other hand, particularly because of their repeatedly utilized phase conversion particularly upon the occurrence of sudden heat peaks, serve to actively cool the semiconductor element during operation.

If the heat dissipating device according to the invention is composed of a separate, thin heat dissipating chip between the electronic chip and the housing base, the heat dissipating chip with the deep channels or grooves etched thereinto is made larger than the electronic chip. Thus the thermal flux in the larger dimensioned heat dissipating structure is broadened to the base, thus providing for better heat dissipation from the silicon surface to the housing bottom. This constitutes an improvement, in particular, for permanent operation with continuous heating of the surface of the electronic chip.

Moreover, the channels in the special heat dissipating bodies according to the invention are partially filled (approximately up to three-quarters full) with the phase conversion material in the form of meltable bodies or layers. These meltable bodies or meltable substances are selected in such a way that, in the most frequent case of silicon electronic chips, their phase transition occurs at temperatures between 100° C. and 150° C. As soon as increased temperatures occur at the surface of the standard silicon chip, a phase conversion begins in the meltable thermal bodies, they melt and thus absorb a large portion of the thermal energy.

Another advantage of the separate heat dissipating chips according to the invention is that after manufacture they can be directly soldered to the IC base so that the manufacturers of electronic chips are able to apply their finished electronic chips to the heat dissipating chips by soldering, anodic bonding, etc., without any changes in their production. In contrast thereto, if channels are integrated in the underside of the electronic chip itself, the silicon wafers must be appropriately pretreated before they are divided into individual device chips.

Another advantage is that the heat dissipating chip filled with meltable bodies has a thermal conductivity which is greater by about a factor of 2 to 6 and a somewhat higher thermal capacity than the silicon chip alone. This also increases heat dissipation.

The meltable body becomes liquid as soon as the phase conversion temperature is exceeded. In this liquid state, the thermal conductivity lies above that of the solid state, thus further increasing heat dissipation capability.

For both solutions, special metals and alloys, for example, based on tin, zinc, bismuth, indium or lead, are suitable as meltable substances. However, other materials, such as bees wax and stearin which have a phase conversion point in the upper portion of the stated range, which have a very high melting heat may also be employed. Such other materials should additionally do not undergo too much thermal expansion between their solid and their liquid states and, should be compatible with the materials and techniques employed for silicon.

The heat dissipating device according to the invention is particularly suitable for all types of components formed in silicon or with materials compatible with the silicon technology, such as, for example, gallium arsenide. Thus, the inventive effect of an increased heat dissipation above critical temperatures can be utilized, for example, for integrated circuits, thyristors, semiconductor lasers and sensors, e.g. magnetometers or bolometers.

The special micromechanical etching technique proposed in the above-mentioned book is preferably employed to produce the required channels or grooves since it permits the etching of channels of sufficient depth for the introduction of the phase conversion material. The conventional planar etching techniques for equipping the chip surface are less suitable for this purpose.

Preferably, a specially developed high temperature spin coating process is employed for the introduction of the special meltable substances into the grooves or channels.

The invention will be described below in greater detail with reference to the drawing figures.

DETAILED DESCRIPTION OF THE PREFERRED EMBODIMENTS

Figure 1:
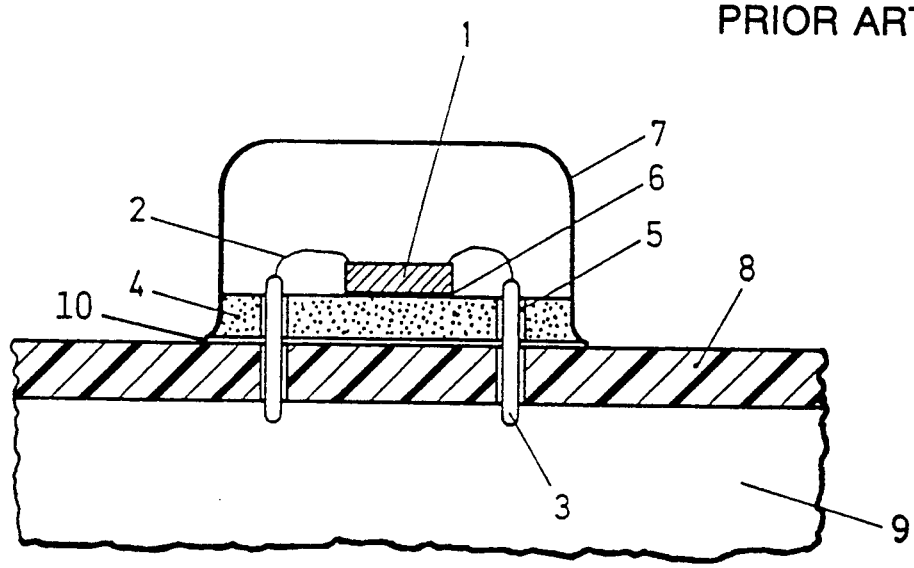
FIG. 1 is a schematic illustration of an electronic chip provided with a prior art heat dissipating arrangement.
Figure 2:
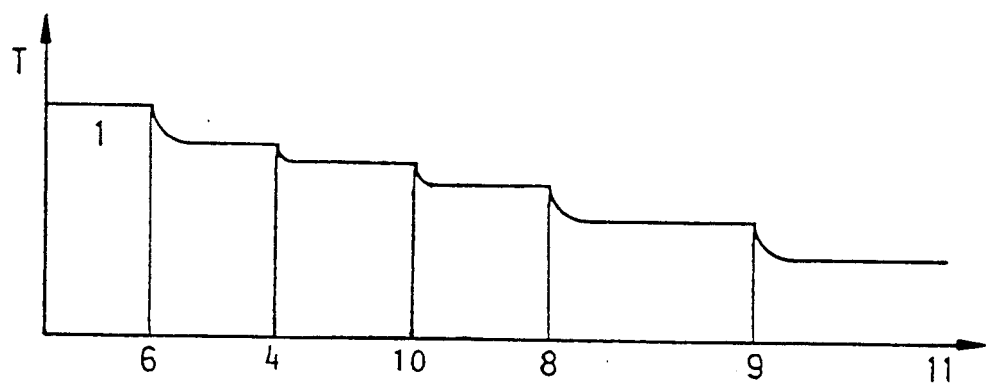
FIG. 2 shows the temperature curve within the arrangement of FIG. 1.
Figure 3:
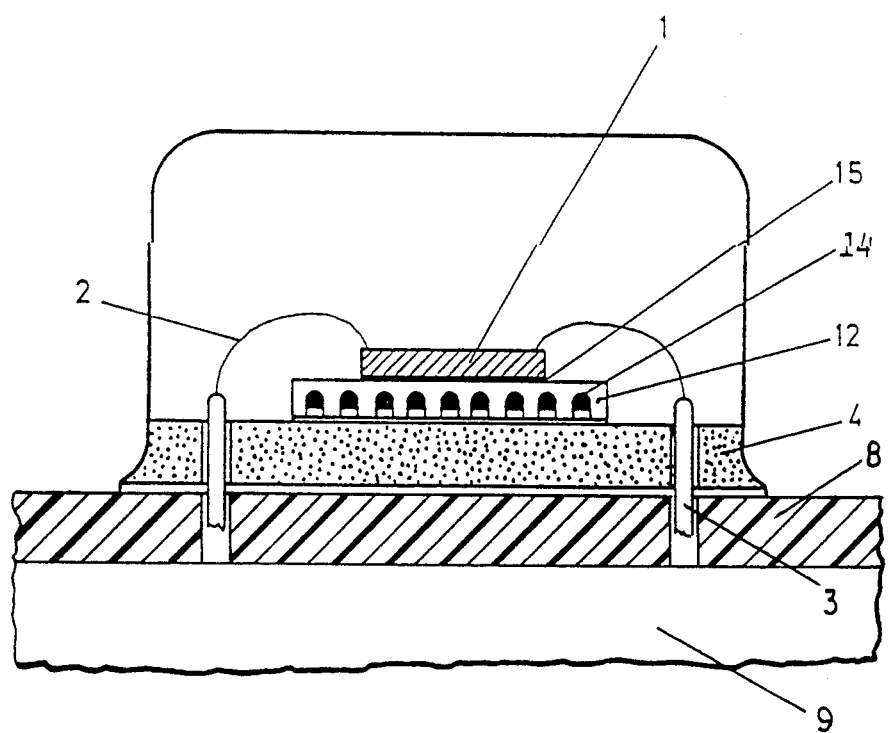
FIG. 3 is a schematic illustration of an embodiment of the heat dissipating arrangement according to one embodiment of the invention.

In FIG. 3, as in the prior art, a semiconductor electronic component chip 1, e.g., of silicon, is connected via bonding wires 2 and contact pins 3 brought through a housing bottom 4 with a printed circuit board 8. Between the underside of the chip 1 and the housing bottom 4, there is disposed the heat dissipating device 12 according to the invention in the form of a further thin semiconductor, i.e., silicon, chip. The heat dissipating chip 12 preferably, as shown, has larger area dimensions than the electronic component chip 1 so a to realize the above-described, improved heat dissipation, particularly for long-term operation. Between component chip 1 and heat dissipating chip or body 12, a glass or a metal layer 15 is provided for a connection by anodic bonding or by metal bonding, respectively. Channels or grooves 13 are formed in the lower surface of the heat dissipating body 12 and are filled approximately to one-half or three quarters with meltable substances or bodies 14.

Figure 3A:
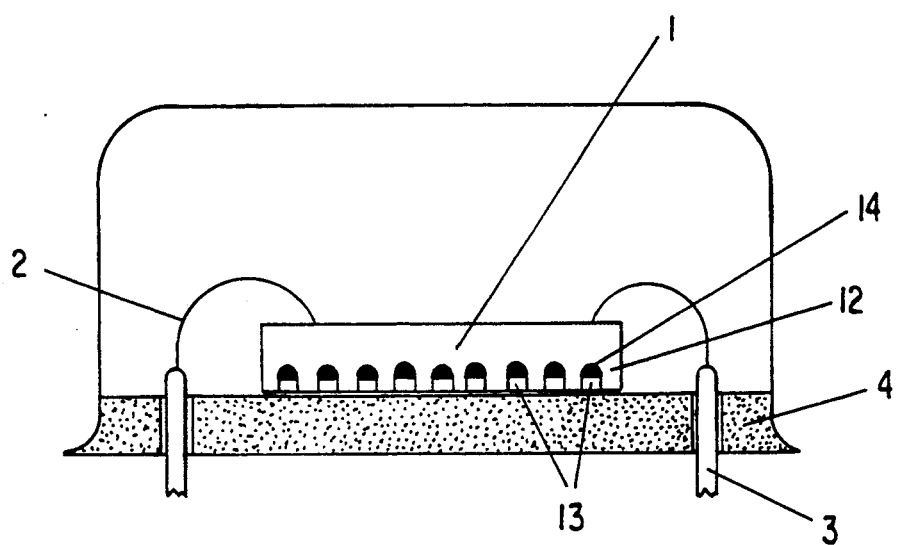
FIG. 3a is a schematic illustration of the heat dissipating arrangement according to a further embodiment of the invention.

In addition to the embodiment of FIG. 3, it is possible to omit the heat dissipating body 12 and to integrate the channels 13 directly in the underside of chip 1 and also fill them with meltable substances 14 as shown in FIG. 3a.

Initially, a method will be described for producing such a heat dissipating arrangement that is integrated in the silicon electronic chip 1. The basis is a conventional semiconductor, preferably silicon, disk or wafer on which a plurality of electronic components are provided and which is eventually to be divided into a plurality of individual component chips. However, the silicon disk or wafer should be polished on both sides in order to be able to perform photolithography and etching methods on the rear surface of the wafer as well as on the front surface. A certain adjustment or alignment of the channels or grooves 13 to be etched into the rear surface with respect to the configuration of the front surface of the chip is necessary, but the adjustment need not meet high requirements with respect to its accuracy. An accuracy of about 5 μm is sufficient. It is merely necessary to observe the orientation of the channels or grooves relative to the crystallographic orientation of the silicon wafer.

The standard for electronic semiconductor components is the [100] orientation of the silicon wafer. In this case, the channels 13 are oriented with the above-mentioned method for orientation dependent etching preferably parallel to the [100] direction. If this method is employed, deep V-shaped troughs are created which have [111] oriented walls. The thus formed channels or grooves 13 are filled with the meltable substances 14 according to the invention.

In another orientation of the silicon wafers, the [110] orientation, the orientation dependent etching permits the production of deep, rectangular channels or grooves 13 having perpendicular [111] walls. Here again the grooves 13 are filled with the meltable substances 14 according to the invention.

For the purpose of filling the channels 13, preferably a recently developed so-called high temperature spin coating method as disclosed in the above identified concurrently filed patent application No. 07/716,261, now abandoned is employed. According to this high temperature spin coating method, which is of the general type used in the past to coat wafers at room temperature, the wafer with the channels or grooves 13 formed therein is suction mounted by subatmospheric pressure on the surface of a heatable turntable with the grooves facing away from the turntable surface. The silicon disc or wafer on the turntable is heated to temperatures barely above the melting point of the meltable material 14. From a likewise heated, thermostat-controlled reservoir vessel, a few drops of the meltable material, e.g., a tin alloy, are applied to the surface containing the grooves 13 of the rotating wafer. In dependence on the rate of rotation and the viscosity of the applied molten material, a metal layer is formed which has a thickness of a few microns. The surface tension causes the molten material to be uniformly retracted into the grooves 13 when the wafer cools after the desired spinning and spreading, and to solidify there.

Moreover, the described developed method employing the heated spin coating apparatus can also be employed generally for the application of metal layers onto wafers. Compared to conventional methods, this results in considerable advantages, particularly for the coating of structured surfaces.

Following this cooling method step, and after any further necessary processing, the wafer with the channels 13 containing the meltable material 14 may be divided into the individual chips in the conventional manner.

The further method step in which the individual chip 1 with the cooling arrangement as its rear surface is fastened to the base or housing bottom 4 as shown in FIG. 3a, should not take place at too high a temperature. An adhesive connection is particularly recommended since this produces a tight connection with the housing base 4 with good thermal conduction.

In the embodiment of the method according to the invention for producing the heat dissipating device in the form of an additional chip 12 between the housing bottom and the underside of the electronic chip 1, the procedure is similar. According to the above-described method steps, channels or grooves 13 are formed in the polished underside of a semiconductor, e.g., silicon, wafer and are partially filled with a meltable substance 14. Then the wafer is divided into individual heat dissipating chips 12 which are larger than the respective electronic chips 1 to be applied thereabove. These heat dissipating chips 12 are then soldered directly onto the IC base or the housing bottom. The IC manufacturer may then apply the respective electronic chips 1 to the thus formed high performance heat dissipating chips 12 by soldering, anodic bonding, etc., with a structure as shown in FIG. 3 resulting.

The table below is a compilation of material data for suitable meltable substances 14. However, in addition to the individual or combined use of these meltable substances or other low melting point metal alloys, any other desired materials, for example, bees wax, stearin, etc., may be employed which meet the above mentioned requirements regarding a suitable phase transition, thermal expansion and compatibility with the respective semiconductor material, the latter not necessarily being silicon. The degree of filling of the channels is adapted to the respective parameters.

| Material | Melting Point °C. | Melting Heat kcal/gmol |
| --- | --- | --- |
| gallium | 29.78 | 1.335 |
| indium | 156.6 | 0.775 |
| tin | 231.9 | 1.69 |
| tin-lead-cadmium-bismuth alloys | 70–150 | |

Figure 4:
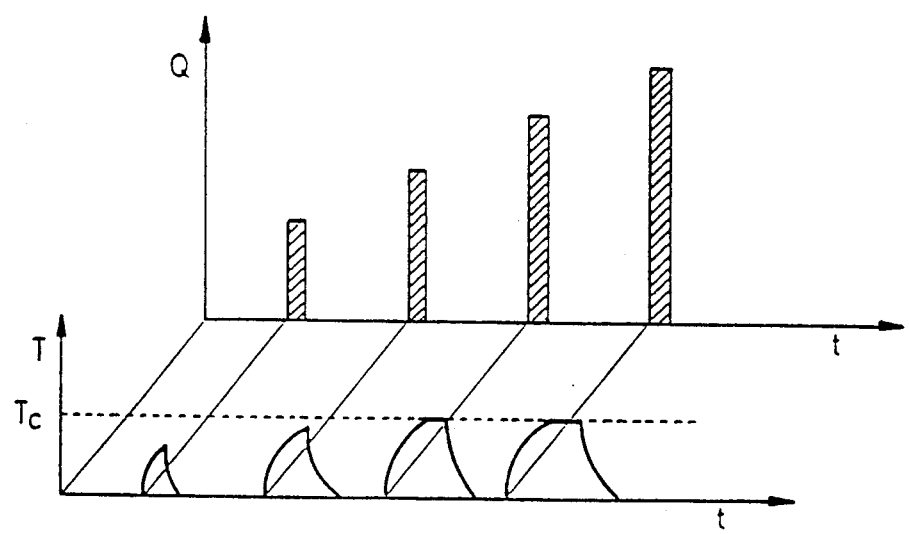
FIG. 4 is a schematic sketch of heat pulses and the correspondingly resulting temperature curve at the chip surface of a device according to the invention.

Regardless of whether the channels 13 filled with meltable material 14 are integrated in the component chips 1 or the additional heat chips 12 are employed, the following effect, which is also independent of the phase conversion material employed and which is shown in FIG. 4, is realized. In FIG. 4, the respectively associated temperature curve is shown for heat energy pulses Q of different magnitude at the chip surface. Due to thermal capacity effects at the chip surface, the heat energy produces the illustrated increases and drops in temperature which have a delay in time at the leading and trailing edges of the pulses. The maximum temperature produced by the first heat pulse (a) is still clearly below the conversion temperature $T_C$ of the particular material 14 employed to fill the channels or grooves 13, while the peak temperature produced by the second heat pulse (b) approaches the conversion temperature. During the third pulse (c), the conversion temperature $T_C$ is exceeded and the heat peak is cut off in that the heat energy generated above $T_C$, i.e., the conversion temperature or melting temperature, is absorbed by the phase conversion of the substance 14. The absorbed quantity of heat is then discharged again with a delay in time during the decaying phase of the temperature curve before a new heat pulse (d) occurs. In other words, the otherwise unavoidably produced short-term heat peaks are reliably avoided by a displacement of the absorption and dissipation of the associated thermal quantities into the time phase in which the chip surface temperature is already in the decaying phase. This clearly shows the particular efficiency of the arrangement according to the present invention for the reduction of critical heat pulses.

The heat dissipating arrangement according to the invention is suitable for all types of chip arrangements. For example, circuits, sensors or optoelectronic components are wired together on so-called mother boards. In such compressed chip systems, the heat dissipation according to the present invention constitutes a considerable improvement in which the substrate arrangement need not be changed.

a) Statement Concerning Dimensions

Typical dimensions: Chip 1: Dimensions are 1-2 mm×1-2 mm area ×380 to 600 μm thickness, or even lower.

Heat dissipation chip 12: Area: 2-3 mm×2-3 mm×380 to 600 μm thickness.

Channels: 50 to 200 μm, typically 100 μm width, length up to 90% of the heat dissipation chip, i.e., e.g. 800 to 1800 μm; the location of the channels should be especially directly under heat generating areas of the chip.

Depth of Channels: Up to 50 to 90%, typically 80% of chip thickness, e.g., 300 μm to 500 μm.

Spacings between channels: 50-200 μm, typically 100 μm.

b) Thermal Effects

A requirement is: The thermal expansion coefficient should be equal to Si, as much as possible.

Nearly no equations (shrinking) should occur during phase transition liquid→solid, e.g. for indium.

c) Materials other than Silicon

Other application areas include LED's and Laser-Diodes, made in GaAs (substrates) with AaAlAs epitaxial layers, or InP substrates and InGaAsP layers for active devices. Limiting temperatures in such case are up to 200° C. As material (14) also indium can be used with, limited $T_{max}$ to 156° C. Other materials (14) may include tin ($T_{max}$ 231° C.).

The invention now being fully described, it will be apparent to one of ordinary skill in the art that any changes and modifications can be made thereto without departing from the spirit or scope of the invention as set forth herein.

What is claimed is:

1. A heat dissipating arrangement for semiconductor electronic components comprising: a chip of semiconductor material having a front surface with a semiconductor circuit component formed therein and a rear surface; a plurality of heat dissipation grooves provided in said rear surface of said semiconductor chip; at least one meltable substance disposed in said grooves with said at least one substance being a substance which is subjected to a heat absorbing phase conversion from solid to liquid when a predetermined temperature which is critical for operation of said semiconductor component is exceeded; and a housing base fastened to said rear surface of said semiconductor chip.

2. A heat dissipating device as defined in claim 1 wherein said at least one meltable substance has a high melting heat, exhibits little expansion between the solid and the liquid state, and is compatible with the materials and techniques of said semiconductor material.

3. A heat dissipating arrangement as defined in claim 2 wherein said semiconductor material is silicon and said at least one meltable substance has a melting point less than 150° C.

4. A heat dissipating arrangement as defined in claim 3 wherein said melting point is in a range from 100° C. to 150° C.

5. A heat dissipating arrangement as defined in claim 3 wherein said at least one meltable substance is composed of at least one of tin, indium, other low melting point metal alloys, waxes, stearin, and combinations thereof.

6. A heat dissipating arrangement as defined in claim 1 wherein said grooves have a width and a spacing which are each of from about 50μ to 200μ, and a depth of from about 50% to 90% of the thickness of said semicondutor chip.

7. A heat dissipation arrangement for a semiconductor electronic component comprising:
a housing base;
a semiconductor heat dissipating chip having a rear surface fastened to said base and a front surface;
a semiconductor component chip having a rear surface bonded to said front surface of said heat dissipating chip;
a plurality of grooves formed in said rear surface of said heat dissipation chip; and
a solid meltable material disposed in and at least partially filling said grooves, said material having a melting point less than a predetermined temperature critical for proper operation of said semiconductor component and undergoing a heat absorbing phase conversion from solid to liquid when heated to exceed said predetermined temperature.

8. A heat dissipation arrangement as defined in claim 7 wherein said heat dissipation chip is larger in area than said component chip.

9. A heat dissipation arrangement as defined in claim 8 wherein the semiconductor material of at least said component chip is silicon and said melting point of said meltable material is in the range of 100° C. to 150° C.

10. A heat dissipation arrangement as defined in claim 7 wherein said meltable material is at least one of a metal, a metal alloy, bees wax and stearin.

11. A heat dissipation arrangement as defined in claim 7 wherein said grooves have a width and a spacing which are each of from about 50μ to 200μ.

12. A heat dissipation arrangement as defined in claim 11 wherein said grooves have a depth of from about 50 to 90% of the thickness of said heat dissipating semiconductor chip.

13. A heat dissipation arrangement as defined in claim 6 wherein said semiconductor chip has a maximum thickness of approximately 600 μm.

14. A heat dissipation arrangement as defined in claim 12 wherein said semicondutor chip has a maximum thickness of approximately 600 μm.

* * * * *